United States Patent [19]

Okuno et al.

[11] Patent Number: 5,232,813
[45] Date of Patent: Aug. 3, 1993

[54] PS PLATE FOR USE IN MAKING LITHOGRAPHIC PRINTING PLATE REQUIRING NO DAMPENING WATER UTILIZING IRRADIATION CURED PRIMER LAYER CONTAINING POLYURETHANE RESIN AND DIAZONIUM SALT POLYCONDENSATE PHOTOPOLYMERIZABLE LIGHT-SENSITIVE LAYER AND SILICONE RUBBER LAYER

[75] Inventors: Kei Okuno; Nobuyuki Kita, both of Shizuoka, Japan

[73] Assignee: Fuji Photo Film Co., Ltd., Minami-ashigara, Japan

[21] Appl. No.: 643,893

[22] Filed: Jan. 22, 1991

[30] Foreign Application Priority Data

Jan. 31, 1990 [JP] Japan .................................. 2-21072
Mar. 28, 1990 [JP] Japan .................................. 2-79572

[51] Int. Cl.⁵ ...................... G03F 7/021; G03F 7/095; G03F 7/11
[52] U.S. Cl. ................................ 430/156; 430/157; 430/162; 430/163; 430/272; 430/273; 430/303
[58] Field of Search ............... 430/156, 157, 158, 303, 430/162, 163, 272, 273

[56] References Cited

U.S. PATENT DOCUMENTS

| | | |
|---|---|---|
| 4,342,820 | 8/1982 | Kinashi et al. ...................... 430/303 |
| 4,826,752 | 5/1989 | Yoshida et al. ..................... 430/303 |
| 4,853,313 | 8/1989 | Mori et al. .......................... 430/303 |
| 4,956,261 | 9/1990 | Pawlowski et al. ................. 430/156 |

Primary Examiner—Charles L. Bowers, Jr.
Assistant Examiner—Christopher G. Young
Attorney, Agent, or Firm—Burns, Doane, Swecker & Mathis

[57] ABSTRACT

A dry PS plate comprises a substrate having provided thereon in order a primer layer, a light-sensitive layer and a silicone rubber layer wherein the primer layer comprises a film forming polyurethane resin and a diazonium salt polycondensate. The dry PS plate is excellent in the adhesion strength between the substrate and the light-sensitive layer. The adhesion is surely maintained even after imagewise exposure to light and the subsequent development. The dry PS plate shows excellent image reproduction and the resulting dry lithographic plate is excellent in printing durability as well as resistance to scratch.

18 Claims, No Drawings

PS PLATE FOR USE IN MAKING LITHOGRAPHIC PRINTING PLATE REQUIRING NO DAMPENING WATER UTILIZING IRRADIATION CURED PRIMER LAYER CONTAINING POLYURETHANE RESIN AND DIAZONIUM SALT POLYCONDENSATE PHOTOPOLYMERIZABLE LIGHT-SENSITIVE LAYER AND SILICONE RUBBER LAYER

BACKGROUND OF THE INVENTION

The present invention relates to a presensitized plate for use in making a lithographic printing plate requiring no dampening water (hereinafter referred to as "dry PS plate") and in particular to a dry PS plate which is excellent in adhesion between a substrate and a light-sensitive layer in wet state during developing treatment and which can provide a lithographic printing plate requiring no dampening water (hereunder referred to as "dry lithographic plate") improved in the printing durability and resistance to scratch.

There have been proposed a variety of dry PS plates in which a silicone rubber layer serves as non-image areas (see, for instance, Japanese Patent Publication for Opposition Purpose (hereunder referred to as "J.P. KOKOKU") Nos. Sho 44-23042 (U.S. Pat. No. 3,677,178), Sho 46-16044 (U.S. Pat. No. 3,511,178), Sho 54-26923 (U.S. Pat. No. 3,894,873), Sho 61-54222 (U.S. Pat. No. 4,342,820) and Sho 63-26247).

There have been known two types of methods for making printing plates from dry PS plates of this kind, one of which comprises dissolving a light-sensitive layer on the image areas with a developer to remove a silicone rubber layer present thereon to thus give images (J.P. KOKOKU No. Sho 46-16044 (U.S. Pat. No. 3,511,178)) and the other of which uses a dry PS plate comprising a photoadhesive light-sensitive layer or a photopeelable light-sensitive layer and a silicone rubber layer, comprises selectively removing only the silicone rubber layer on the image areas (see J.P. KOKOKU No. Sho 54-26923 and Japanese Patent Unexamined Publication (hereunder referred to as "J.P. KOKAI") No. Sho 56-B0046 (U.S. Pat. No. 4,342,820)).

The latter case will be explained below using a dry PS plate comprising a photoadhesive light-sensitive layer and a silicone rubber layer by way of example. The photoadhesive light-sensitive layer and the silicone rubber layer of this PS plate are strongly adhered to one another upon exposure to light. Therefore, the development of the exposed PS plate is performed using a developer which does not substantially dissolve but only partially dissolve the photoadhesive light-sensitive layer and is capable of swelling the light-sensitive layer and/or the silicone rubber layer. Thus, the silicone rubber layer on the image areas is selectively removed and peeled off to reveal the light-sensitive layer which serves as an ink receiving area. However, this plate making method suffers from the following problems. For instance, since the adhesion between the light-sensitive layer and the substrate is insufficient, a part of the light-sensitive layer on non-exposed areas is peeled off, as a result the surface of the substrate is exposed. The ink receptivity of the light-sensitive layer is different from that of the exposed substrate. This difference is possibly reflected on the printed matters and thus satisfactory copies cannot be obtained at all.

Under such circumstances, many attempts have been directed to the improvement in the adhesion between the light-sensitive layer and the substrate. For instance, J.P. KOKOKU No. Sho 61-54291 discloses a method in which a primer layer containing an epoxy resin is positioned between these layers. This Primer layer can ensure good adhesion to the substrate, but the adhesion thereof to the light-sensitive layer is greatly affected by components of the latter. More specifically, if the components of the light-sensitive layer are changed in order to improve, for instance, the printing durability and resistance to scratch of the resulting lithographic plate as well as the sensitivity and fine image-reproduction of the PS plate, the adhesion between the primer layer and the light-sensitive layer is impaired.

Moreover, the resistance to scratch of the PS plate is greatly dependent upon the flexibility of the light-sensitive layer as well as that of the primer layer. In this respect, there has long been desired for the development of a primer layer having flexibility higher than that of the epoxy resins. As an attempt for improving the flexibility of the primer layer, there has been proposed a dry PS plate comprising a photopeelable light-sensitive layer wherein a primer layer comprising a polyurethane resin is used (see J.P. KOKAI No. Sho 61-163343). However, this dry PS plate is still insufficient in the adhesion of the primer layer to the substrate.

SUMMARY OF THE INVENTION

Accordingly, an object of the present invention is to provide a dry PS plate provided with a novel primer layer which is excellent in adhesion between a substrate and a light-sensitive layer and which can provide a dry lithographic printing plate improved in the printing durability and resistance to scratch.

The foregoing object and other objects of the present invention can be achieved by a dry PS plate which comprises a substrate having provided thereon a primer layer, a light-sensitive layer and a silicone rubber layer in this order, wherein the primer layer comprises a film forming polyurethane resin and a diazonium salt polycondensate.

DETAILED DESCRIPTION OF THE INVENTION

The dry PS plate of the present invention will hereunder be explained in more detail.

Substrate

The dry lithographic printing plate must have flexibility sufficient for putting it on the usual printing press or the like and can withstand the load which is applied thereto during printing operation. For this reason, typical substrates usable are, for instance, a metal plate such as an aluminum, copper or steel plate, a plastic film such as a polyethylene terephthalate film, coated paper, a rubber plate or a composite plate thereof as well as substrates having rubber elasticity, those provided with a layer having rubber elasticity or cylindrical substrates.

Preferred substrates are aluminum plates and gelatin undercoated plastic films. The aluminum plates used in the present invention are plate-like materials of pure aluminum or an aluminum alloy comprising aluminum and a trace amount of other elements such as silicon, iron, manganese, copper, magnesium, chromium, zinc, bismuth, nickel and/or titanium The amount of the elements other than aluminum is at most 10% by weight. The aluminum substrate preferably used in the invention is a pure aluminum plate, but it is presently difficult to obtain a completely pure aluminum plate from the viewpoint of refining technique. Therefore, an aluminum plate containing other elements as low as possible is employed. The aluminum plate containing other elements in the order of the foregoing range can be used in the invention without any problem. In other words, the aluminum plates usable in the invention are not restricted to those having specific compositions and may be those commonly known and used in this art. The aluminum plate used in the invention has a thickness in the order of about 0.1 to 0.5 mm.

Such an aluminum plate is optionally treated with an aqueous solution containing a surfactant or an aqueous alkaline solution to remove the rolling oil from the surface thereof.

The aluminum plate thus degreased may optionally be subjected to anodization and/or hydrophilization treatments.

The hydrophilization may preferably be performed by treating the plate with an aqueous solution of an alkali metal silicate or coating the plate with a colloidal silica sol. It is also possible to subject the aluminum plate to such an alkali metal silicate treatment followed by the application of a colloidal silica sol.

Alternatively, the adhesion between the substrate and the primer layer can further be enhanced by surface-treating the substrate with a silane coupling agent. In this surface-treatment, the silane coupling agent is in general used in the form of an aqueous solution having a concentration ranging from 0.1 to 3% by weight, but a sufficient improvement in the adhesion can also be ensured even if the silane coupling agent is used at a concentration lower than that defined above depending on the kinds of the silane coupling agents used and the treating time. The amount of the silane coupling agent to be coated suitably ranges from 5 mg/m$^2$ to 100 mg/m$^2$ (weighed after drying).

Primer Layer

In the present invention, the primer layer comprises a film forming polyurethane resin and a diazonium salt polycondensate. The primer layer containing the diazonium polycondensate has higher adhesion to the substrate than the primer layer not containing the diazonium polycondensate.

After the primer layer containing the polyurethane resin and the diazonium salt polycondensate is applied to the substrate and before a light-sensitive layer is applied to the primer layer, it is preferable to expose the primer layer to actinic rays or electron beams to cure the primer layer. The exposure improves the adhesion to a substrate, particularly a hydrophilized aluminum substrate and a gelatin undercoated plastic film substrate and resistance to a solvent.

The diazonium salt polycondensate used in the present invention is a light-sensitive compound having a structural unit of formula (I):

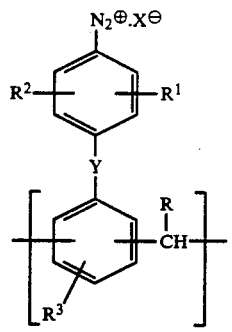

wherein $R^1$, $R^2$ and $R^3$ represent hydrogen atoms, halogen atoms, alkyl, alkoxy, aryl, substituted aryl, sulfonic acid, sulfoalkyl, carboxyl or carboxylic acid ester groups, R represents a hydrogen atom, an alkyl, aryl, substituted aryl or carboxyl group, X represents a counter anion of the diazonium salt, Y represents —(CH$_2$)$_q$—NR$^4$—, —O—(CH$_2$)$_r$—NR$^4$—, —S—(CH$_2$)$_r$—NR$^4$—, —S—CH$_2$CONR$^4$—, —O—R$^5$—O—, —O—, —S— or —CONR$^4$— wherein q is an integer of 0 to 5 and r is an integer of 2 to 5, $R^4$ represents a hydrogen atom, an alkyl group having 1 to 5 carbon atoms, an aralkyl group having 7 to 12 carbon atoms or an aryl group having 6 to 12 carbon atoms and $R^5$ represents an arylene group having 6 to 12 carbon atoms.

The diazonium salt polycondensate can be prepared by condensing a corresponding aromatic diazonium salt with a compound having an active carbonyl group such as formaldehyde and substituting an anion of the polycondensate with a desired anion. Preferred diazonium polycondensates include hexafluorophosphates, tetrafluorborates and phosphates of polycondensates of p-diazodiphenylamine and formaldehyde or acetaldehyde. Further, preferred are sulfonates (e.g. p-toluenesulfonates, dodecylbenzenesulfonates and 2-methoxy-4-hydroxy-5-benzoylbenzenesulfonates), phosphinates (e.g. benzenephosphinates), hydroxy group containing compound salts (e.g. 2,4-dihydroxybenzophenone salts) and organic carboxylates of polycondensats of p-diazodiphenylamine with formaldehyde as disclosed in U.S. Pat. No. 3,300,309. Particularly preferred are diazonium salt polycondensates having higher degree of polymerization as disclosed in J.P.KOKAI Nos. Sho 59-78340 and 63-262643.

Moreover, preferred are mesitylenesulfonates of polycondensates of 3-methoxy-4-diazodiphenylamine with 4,4'-bispolycondensates methoxymetyl-diphenylether as disclosed in J.P.KOKAI No. Sho 58-27141.

The film forming polyurethane resin used in the present invention as another component of the primer layer is a polymer obtained by an addition reaction between a polyisocyante and a polyol. The weight average molecular weight of the polyurethane resin is suitably more than 5,000, more preferably 10,000 to 200,000.

The polyisocyanate includes toluene diisocyante, xylene diisocyanate, diphenylmethane diisocyante, hydrogenated diphenylmethane diisocyante, hexamethylene diisocyanate, morpholine diisocyanate, diphenylether diisocyante, lysin diisocyante, isophorone diisocyante,

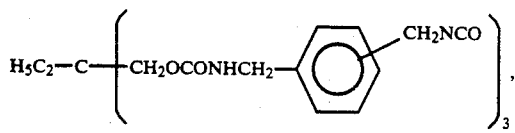

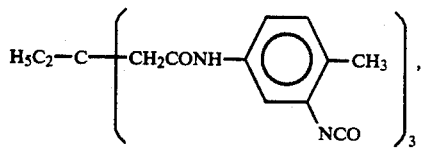

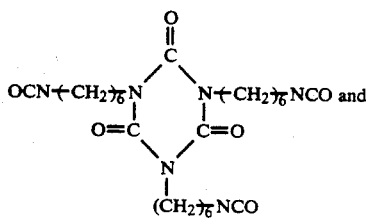

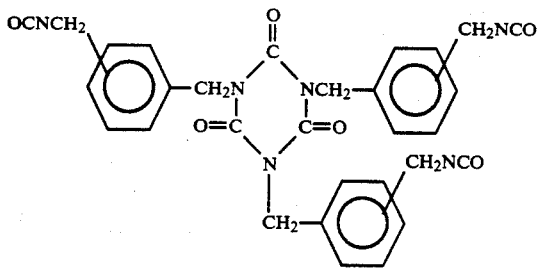

Examples of the polyols include polyethylene glycol, polyester diol, polyetherester diol, ethylene glycol, diethylene glycol, neopentyl glycol, polypropylene glycol, polybuthylene glycol, triethylene glycol, hexamethylene glycol, propylene glycol, dipropylene glycol, tripropylene glycol, polyurethane polyol and unsaturated polyester polyol. In the present invention, a polymer obtained by a conventional addition reaction between the polyisocyanate and the polyol can be used as such. It is also possible to use a higher molecular weight polymer obtained by the addition reaction in the presence of polyamine or water as a crosslinking agent or a chain extender. Further, there may be used a polyurethane resin having terminal isocyanate groups which is obtained by adding an excessive amount of the polyisocyanate to the reaction system during the reaction between the polyisocyante and the polyol; a polyurethane resin to which terminal hydroxyl groups are introduced by reacting diethanolamine or monoethanolamine with a polyurethane having terminal isocyante groups; or a crosslinked polyurethane film obtained by adding a polyisocyanate compound known as a crosslinking agent.

The diazonium salt polycondensate and the polyurethane resin are dissolved in an appropriate solvent, coated on a substrate and dried and optionally exposed to actinic rays or electron beams to decompose the diazonium salt whereby the primer layer is produced. The primer layer may contain a silane coupling agent, in particular, a silane coupling agent having an amino, epoxy or mercapto group to improve the adhesion to the substrate. The amount of the silane coupling agent to be added is preferably 0.1 to 5% by weight based on the solid content of the primer layer. Further, the primer layer may contain dyes or pigments as antihalation agents, $TiO_2$ as whitening agents, fading dyes or coloring dyes as printing out agents, photo acid generating agents, photo reducing agents, epoxy resins, nitrocellulose resins, ketone resins, melamine resins, alkyd resins, vinylacetate copolymers, vinylchloride copolymers, photopolymerization initiators, (meth)acryl monomers or prepolymers, silicone type surfactants or fluorine atom containing surfactants.

The amount of the diazonium salt polycondensate in the primer layer is preferably 0.1 to 20%, more preferably 0.5 to 10% by weight based on the polyurethane resin. The amount of the primer layer coated is preferably 1 to 50 $g/m^2$ after drying.

Light-Sensitive Layer

The light-sensitive layer used in the present invention preferably comprises a photopolymerizable light-sensitive composition which contains the following components:

(a) a photopolymerizable monomer or oligomer composed of an ethylenically unsaturated monomer or oligomer having a boiling point of not less than 100° C.;

(b) a photopolymerization initiator; and (c) an optional heat polymerization inhibitor.

Each component of the light-sensitive layer will be explained below in more detail.

Component (a): Photopolymerizable Monomer or Oligomer

As the foregoing monomers or oligomers usable in the present invention, there may be mentioned, for instance, (meth) acrylates or (meth)acrylamides having a boiling point of not less than 100° C. derived from monovalent alcohols or monovalent amines having 30 or less carbon atoms and (meth)acrylates or (meth)acrylamides having a boiling point of not less than 100° C. derived from polyvalent alcohols or polyvalent amines having 80 or less carbon atoms.

Typical examples of the monomers used in the present invention are listed below, some of which can be used as starting materials for the oligomers used in the present invention.

(a-1): (Meth)acrylates of the following alcohols Methanol, ethanol, propanol, pentanol, cyclohexanol, octanol, undecanol, norbornyl alcohol, polymethylene glycol, ethylene glycol, polyethylene glycol, propylene glycol, polypropylene glycol, glycerol, trimethylol methane and pentaerythritol (a-2) Addition products between glycidyl (meth)acrylates with hydrogen halides, amines or carboxylic acids, for example,

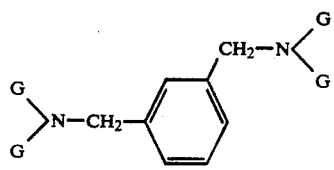

-continued

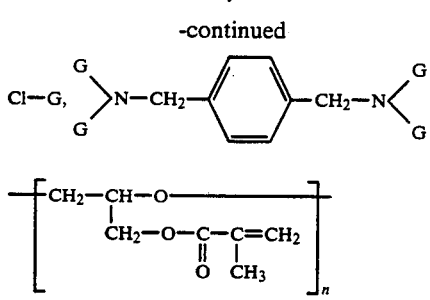

wherein G represents —CH₂CHOH—CH₂—O—CO—CCH₃═CH₂ and n is a positive integer.

(a-3): (Methy)acrylamides (Meth)acrylamide, N-methylol (meth)acrylamide, N-methoxymethyl (meth)acrylamide, methylene bis(meth)acrylamide, hexamethylene bis(meth)acrylamide, diacetone acrylamide and hydroxymethyl diacetone acrylamide.

Most usable monomers used in the photopolymerizable light-sensitive material of the present invention are as follows.

Ethyleneglycol di(meth)acrylate, polyethyleneglycol di(meth)acrylate, trimethylolethane tri(meth)acrylate, trimethylolpropane tri(meth)acrylate, pentaerythritol tetra(meth)acrylate, pentaerythritol tri(meth)acrylate, dipentaerythritol penta(meth)acrylate and dipentaerythritol hexa(meth)acrylate.

Component (b): Photopolymerization Initiator

Typical examples of the photopolymerization initiators usable in the present invention are as follows:

(b-1) Benzophenones such as benzophenone, Michler's ketone, xanthone, anthrone, thioxanthone, acridone, 2-chloroacridone and 2-chloro-N-n-butylacridone;

(b-2) Benzoins such as benzoin, benzoin methyl ether and benzoin ethyl ether;

(b-3) Quinones such as p-benzoquinone, β-naphthoquinone and β-methylanthraquinone;

(b-4) Sulfur atom-containing compounds such as dibenzyldisulfide and di-n-butyldisulfide;

(b-5) Azo or diazo compounds such as 2-azo-bis-isobutyronitrile, 1-azo-bis-1-cyclohexanecarbonitrile, p-diazobenzylethylaniline and Congo Red;

(b-6) Halogen atom-containing compounds such as carbon tetrabromide, silver bromide, α-chloromethylnaphthalene and trihalomethyl-s-triazine compounds;

(b-7) Peroxides such as benzoyl peroxide; and (b-8) Uranyl salts such as uranyl nitrate.

The amount of the photopolymerization initiator to be added to the light-sensitive layer ranges from 0.1 to 20% by weight and preferably 3 to 15% by weight on the basis of the total weight of the composition of the light-sensitive layer.

Component (c): Heat Polymerization Inhibitor

Useful examples thereof are hydroquinones, phenols, nitrosubstituted benzenes, tertiary amines and phenothiazines.

In the preferred embodiments of the present invention, a film forming solvent soluble polyurethane resin is used as a binder for the photopolymerizable light-sensitive materials. Preferably, the structural unit of the film forming solvent soluble polyurethane resin is identical with or similar to that of the polyurethane resin used in the primer layer. This is because it is expected that intermolecular hydrogen bonds through urethane or urea bonds are formed between the primer layer and the light-sensitive layer so that the adhesion between the two layers are greatly improved. In particular, if the same compound is used in both the primer layer and the light-sensitive layer, it is expected that the adhesion between the two layers is much more increased.

Preferred polyurethane resins used as a binder for the light-sensitive layer include those derived from a polyisocyanate and a polyester polyol, polyether polyol or polyalcohol; and polyurethane resins having urea bonds which are obtained by substituting a polyamine for a part of the polyol and chain-extending.

Examples of the polyester polyols include condensed type polyester polyols, lactone type polyester polyols and polycarbonate diols. The condensed type polyester polyols are obtained by dehydrating condensation between adipic acid and ethylene glycol, diethylene glycol, propylene glycol, 1,4-butane diol, neopentyl glycol, trimethylol propane, 1,6-hexane diol or the like.

The lactone type polyester polyols are obtained by, for instance, ring opening polymerization between ε-caprolactone and a diol. The polycarbonate diols are obtained by, for instance, a reaction between 1,6-hexane diol and ethylene carbonate.

The polyether polyols are obtained by a reaction between an alkylene oxide such as propylene oxide and ethylene Oxide, and a initiator having active hydrogen.

Examples of the polyalcohos include ethylene glycol, diethylene glycol, propylene glycol, 1,4-butane diol, neopentyl glycol, trimethylol propane and 1,6-hexane diol.

Examples of the polyisocyanates include 1,5-naphthalene diisocyante, tolylene diisocyante, hexamethylene diisocyante, isophorone diisocyante, p-phenylene diisocyanate, xylylene diisocyante, lysine diisocyanate, tetramethylxylene diisocyanate, lysine ester triisocyanate, 1,6,11-undecane triisocyanate, 1,8-diisocyanate-4-isocyanate methyl octane, 1,3,6-hexamethylene triisocyanate and bicycloheptane triisocyanate.

Examples of the polyamines include diphenylmethane diamine derivatives, m-phenylene diamine derivatives, ethylene diamine, 1,4-diaminobutane, 1,6-diaminohexane and isophorone diamine.

The amount of the polyurethane resin to be contained in the light-sensitive layer is preferably 10 to 90% by weight based on the solid content of the light-sensitive layer.

In addition to the above mentioned photopolymerizable light-sensitive materials, there may be used such light-sensitive materials that when exposed to light, change the solubility thereof in a developer or change the adhesion between an overlying silicone rubber layer and the light-sensitive layer. Such light-sensitive materials include a light-sensitive composition comprising a photodimerizable light-sensitive compound, a photohardenable diazo resin light-sensitive compound and an o-quinonediazide compound disclosed in J.P.KOKAI No. Sho 62-50760.

The light-sensitive layer may contain various additives. For instance, there may be mentioned a stabilizer such as hydroquinone, p-methoxyphenol, di-t-butyl-p-cresol, pyrogallol, t-butylcatechol, benzoquinone, 4,4'-thiobis(3-methyl-6-t-butylphenol), 2,2'-methylenebis(4-methyl-6-t-butylphenol) and 2-mercaptobenzimidazole. In addition, the light-sensitive layer may optionally comprise dyes and/or pigments for coloring the layer as well as pH indicators, leuco dyes and/or fading dyes as printing out agents. It is also possible to incorporate, into the light-sensitive layer, a small amount of a silicone compound selected from the group consisting of polydimethylsiloxane, methylstyrene-modified polydimethylsiloxane, olefin-modified polydimethylsiloxane, silane coupling agents, silicone diacrylates and silicone dimethacrylates. The light-sensitive layer may further comprise fluorine atom-containing surfactants in order to improve coating properties thereof. Besides, it is also possible to add, to the light-sensitive powder or hydrophobic silica powder whose surface is treated with a silane coupling agent carrying a (meth)acryloyl or aryl group in an amount of not more than 50% by weight on the basis of the total weight of the light-sensitive layer to enhance the adhesion of the light-sensitive layer to a silicone rubber layer which is subsequently applied thereto and will be detailed below. Other additives which may be added to the light-sensitive layer include epoxy resins, ketone resins, melamine resins, alkyd resins, vinyl acetate copolymers, vinyl chloride copolymers and diazonium salt polycondensates.

The composition for the foregoing light-sensitive layer is dissolved in a proper solvent or any combination thereof such as 2-methoxyethanol, 2-methoxyethyl acetate, methyl lactate, ethyl lactate, propylene glycol monomethyl ether, propylene glycol monomethyl ether acetate, methanol, ethanol, methyl ethyl ketone, water or a combination thereof and then applied to the primer layer and dried. The amount thereof coated suitably ranges from about 0.1 to 10 g/m$^2$, preferably 0.5 to 5 g/m$^2$ (weighed after drying).

Silicone Rubber Layer

The silicone rubber layer used in the present invention is a layer of linear or partially crosslinked polydiorganosiloxane comprising the following repeating units:

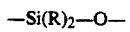

wherein R represents a monovalent group such as an alkyl, aryl or alkenyl group or a combination thereof which may have functional groups selected from the group consisting of halogen atoms, amino groups, hydroxyl group, alkoxy groups, aryloxy groups, (meth)acryloxy groups and thiol groups. The silicone rubber layer may optionally comprise fine powder of an inorganic substance such as silica, calcium carbonate or titanium oxide; an auxiliary agent for adhesion such as the aforementioned silane coupling agents, titanate coupling agents or aluminum coupling agents; and/or a photopolymerization initiator.

Polysiloxanes having functional groups at the ends thereof and a molecular weight of from several thousands to several hundreds of thousand are in general used as starting materials for polymers (silicone rubbers) having the foregoing polysiloxane chain as the main skeleton. The silicone rubber layer can be obtained by crosslinking and hardening the starting material in accordance with the following method. In other words, the silicone rubber layer can be obtained by mixing the foregoing polysiloxane having hydroxyl group(s) at either or both ends thereof with a silane crosslinking agent represented by the following general formula; adding, if necessary, an organometal compound such as an organotin compound, an inorganic acid or an amine as a catalyst and condensing and hardening the polysiloxane and the silane crosslinking agent with heating or at room temperature:

wherein n is an integer of 1 to 3; R is the same as that defined above; and X represents a substituent such as —OH, —OR$^2$, —OAc, —O—N=CR$^2$R$^3$, —Cl, —Br or —I (wherein R$^2$ and R$^3$ may be the same or different and each has the same meaning as that for R defined above and Ac represents an acetyl group).

Alternatively, the silicone rubber layer may be obtained by condensing and hardening the organopolysiloxane carrying hydroxyl groups at the ends thereof, a hydrogen polysiloxane crosslinking agent and an optional silane crosslinking agent defined above.

Useful examples of the silicone rubber layer further include addition type silicone rubber layer obtained by crosslinking ≡SiH groups and —CH=CH— groups through an addition reaction. The addition type silicone rubber layer is rather unaffected by humidity during hardening the same, undergoes crosslinking at high speed and hence a crosslinked silicone rubber layer having predetermined physical properties can easily be formed. The addition type silicone rubber layer herein used can be obtained through a reaction of polyvalent hydrogen organopolysiloxane with a polysiloxane compound having two or more —CH=CH— bonds in the molecule and desirably those obtained by hardening and crosslinking a composition comprising the following components:

(1) 100 parts by weight of an organopolysiloxane having at least two alkenyl groups (preferably a vinyl group) per molecule which are directly bonded to the silicon atom;

(2) 0.1 to 1,000 parts by weight of an organo hydrogen polysiloxane having at least two ≡SiH bonds per molecule; and (3) 0.00001 to 10 parts by weight of a catalyst for addition polymerization.

The alkenyl group of Component (1) may be present either in the middle of or at the ends of the molecular chain and the organopolysiloxane may have organic substituents other than the alkenyl group, such as substituted or unsubstituted alkyl and/or aryl groups. Component (1) may contain a small number of hydroxyl groups. Component (2) reacts with Component (1) to form a silicone rubber layer and serves to impart, to the silicone rubber layer, adhesion to the light-sensitive layer. The hydrogen atom of Component (2) may be present in the middle of or at the end of the molecular chain and Component (2) may also have organic groups selected from the group consisting of those defined above in connection with Component (1). It is preferred that at least 60% of the organic groups of Components (1) and (2) be methyl groups from the viewpoint of ink repellency of the resulting silicone rubber layer. Components (1) and (2) may have a linear, cyclic or branched structure and the molecular weight of at least one of them preferably exceeds 1,000 from the viewpoint of physical properties of the rubber layer and more preferably the molecular weight of Component (1) exceeds 1,000.

Examples of Component (1) are α, ω-divinyl-polydimethyl siloxane and methylvinyl siloxane-co-dimethylsiloxane having methyl groups at both ends; those of Component (2) are polydimethylsiloxane having hydrogen atoms at both ends, α, ω-dimethylpolymethyl hydrogen siloxane, methyl hydrogen siloxane-co-dimethylsiloxane having methyl groups at both ends and cyclic polymethyl hydrogen siloxane.

The addition catalysts, Component (3), may be selected from any known ones, but platinum compounds are particularly preferred and examples thereof are elemental platinum, platinum chloride, chloroplatinic acid and platinums coordinated with olefins.

The composition for obtaining the silicone rubber layer may optionally comprise a crosslinking inhibitory agent such as a vinyl group-containing organopolysiloxane (e.g., tetracyclo(methylvinyl)siloxane), a carbon-carbon triple bond-containing alcohol, acetone, methyl ethyl ketone, methanol, ethanol or propylene glycol monomethyl ether for controlling the hardening speed of the composition.

These compositions undergo an addition reaction and thus start hardening as soon as the foregoing three components are mixed together. In this respect, the hardening speed is rapidly increased as the reaction temperature is elevated. Therefore, it is preferred that the composition be maintained under a high temperature condition at which the properties of the substrate and the photopolymerizable light-sensitive layer are not changed till the composition is completely hardened for the purpose of shortening the time for hardening it on the light-sensitive layer and for extending the pot life thereof. Thus, stable adhesion between the rubber layer and the light-sensitive layer can be ensured.

In addition to the foregoing components, the composition for the silicone rubber layer may comprise a known adhesion-imparting agent such as an alkenyl trialkoxysilane, a hydroxyl group-containing organopolysiloxane and a hydrolyzable functional group-containing silane (or siloxane) which are components of the condensed silicone rubber layers. Moreover, a known filler such as silica may be added to the composition in order to improve the strength of the resulting silicone rubber layer.

In the present invention, the silicone rubber layer ultimately serves as an ink repellent layer. If the thickness thereof is too small, the ink repellency thereof is lowered and the resulting layer is easily damaged. On the other hand, if the thickness is too great, the developability of the resulting PS plate is impaired. Thus, it preferably ranges from 0.5 to 5 μm.

In the dry PS plate explained above, it is also possible to apply a variety of other silicone rubber layers on the foregoing silicone rubber layer. An adhesive layer may be applied between the light-sensitive layer and the silicone rubber layer for preventing poisoning by the catalyst present in the composition and for enhancing the adhesion between the light-sensitive layer and the silicone rubber layer.

A polymer coating may be applied to the surface of the silicone rubber layer or a polymer film may be laminated with the silicone rubber layer for protecting the surface of the silicone rubber layer. Examples of such polymer coatings or films are transparent films or coatings such as polyethylene, polypropylene, polyvinyl chloride, polyvinylidene chloride, polyvinyl alcohol, polyethylene terephthalate and cellophane films or coatings. It is also possible to mat the outer surface of the transparent films on the silicone rubber layer preferably according to the procedures disclosed in European Patent No. 130222 B.

The dry PS plate of the present invention is first imagewise exposed to light through an original transparency and then developed with a developer capable of dissolving a part of or swelling a part or whole of the image areas on the light-sensitive layer or a developer capable of swelling the silicone rubber layer. In this case, both the silicone rubber layer and a part of the light-sensitive layer in image areas or only the silicone rubber layer in image areas are removed, dependent upon the strength of the developer.

The developer suitably used in the present invention may be any known ones for developing dry PS plates. Examples thereof include aliphatic hydrocarbons such as hexane, heptane, "Isopar E, H and G" (trade names of the aliphatic hydrocarbons available from ESSO CHEMICAL CO., LTD.), gasoline and kerosine, aromatic hydrocarbons such as toluene and xylene, and halogenated hydrocarbons such as trichloro ethylene, to which the following polar solvent is added.

Alcohols such as methanol, ethanol, propanol, benzyl alcohol, ethylene glycol monophenyl ether, 2-methoxyethanol, 2-ethoxyethanol, carbitol monoethyl ether, carbitol monomethyl ether, triethylene glycol monoethyl ether, propylene glycol monomethyl ether, propylene glycol monoethyl ether, dipropylene glycol monomethyl ether, polyethylene glycol monomethyl ether, propylene glycol, polypropylene glycol, triethylene glycol and tetraethylene glycol;

Ketones such as acetone and methyl ethyl ketone; and

Esters such as ethyl acetate, methyl lactate, ethyl lactate, butyl lactate, propylene glycol monomethyl ether acetate, carbitol acetate, dimethyl phthalate and diethyl phthalate.

Particularly preferred developers are those containing 0.1 to 100% by weight of propylene oxide derivatives having an average molecular weight of 100 to 1,000 as disclosed in J.P.KOKOKU NO. Sho 63-21890 and an aqueous developer containing ethylene glycol monoalkyl ether or diethylene glycol monoalkyl ether wherein the alkyl group has 5 to 8 carbon atoms as disclosed in Japanese Patent Application Nos. Hei 1-139558 and Hei 2-27859.

The development of the dry PS plate of the present invention can be performed by any known method, for instance, by rubbing the plate surface with a pad for development containing the foregoing developer. Thus, the silicone rubber layer in image areas are removed to reveal the light-sensitive layer which serves as an ink receiving part. It is also possible to apply the developing method disclosed in J.P.KOKOKU No. Sho 63-33140 wherein a developer capable of dissolving at least a part of the light-sensitive layer in image areas is used to dissolve out a part of or whole the light-sensitive layer in the image areas and then the plate surface is rubbed in the presence of water or a solvent containing water as a main component to peel off the silicone rubber layer in the image areas. In this case, it is preferable to use a method and an automatic processor disclosed in J.P.KOKAI No. Sho 63-163357.

The exposed image areas (or light-sensitive layer) is dyed with a dyeing solution to inspect the resulting plate to thus evaluate the image-forming ability of the plate. Only the exposed areas on the light-sensitive layer are dyed by lightly rubbing the image areas with a soft pad impregnated with the dyeing solution. This makes it possible to confirm whether even the highlight portions on the image areas are sufficiently developed or not. The dyeing solution used comprises, for instance, at least one member selected from the group consisting of water-soluble disperse dyes, acid dyes and basic dyes which are dissolved or dispersed in a solvent selected from the group consisting of water, alcohols, ketones, ethers and mixture thereof. It is also effective to incorporate carboxylic acids, amines, surfactants and/or dyeing aids to enhance the dyeing properties of the solution.

In the dry PS plate of the present invention, the adhesion strength between the substrate and the primer layer and between the primer layer and the light-sensitive layer is remarkably improved, the adhesion is surely maintained even after imagewise exposure to light and the subsequent development. The dry PS plate shows excellent image reproduction and the resulting dry lithographic plate is excellent in printing durability as well as resistance to scratch.

The present invention will hereinafter be explained in more detail with reference to the following non-limitative working Examples and Preparation Examples. Moreover, the practical effects achieved by the invention will also be discussed in detail in comparison with Comparative Examples. "%" means "% by weight" unless otherwise indicated.

Preparation Example 1

40.06 Parts by weight of a commercially available polyester polyol (OD-X-105: adipic acid/ethylene glycol/1,4-butanediol condensate (molecular weight =2,000); available from DAINIPPON INK AND CHEMICALS, INC.), 6.50 parts by weight of 1,4-butanediol and 23.34 parts by weight of isophorone diisocyanate were dissolved in 46.6 parts by weight of dimethylacetamide and reacted at 90° C for 6 hours to obtain 60% polyurethane resin solution (I).

Preparation Example 2

40.06 Parts by weight of a commercially available polyester polyol (OD-X-105: adipic acid/ethylene glycol/1,4-butanediol condensate (molecular weight=2,000); available from DAINIPPON INK AND CHEMICALS, INC.), 3.25 parts by weight of 1,4-butanediol and 23.34 parts by weight of isophorone diisocyanate were dissolved in 45.57 parts by weight of dimethylacetamide and reacted at 90° C for 6 hours. To the reaction mixture, 1.71 parts by weight of isophoronediamine was added as a chain extender and the reaction was continued at 90° C for 2 hours to obtain 60% polyurethane resin solution (II).

EXAMPLES 1

To the surface of a smooth aluminum plate having a thickness of 0.24 mm which had been degreased in the usual manner, the following composition for a primer layer was applied so that the amount thereof coated was 4 g/m² (weighed after drying) and then heated at 100° C. for 2 minutes to dry and cure the coated film.

| Component | Amount (part by weight) |
| --- | --- |
| Polyurethane solution (I) of Prep. Ex. 1 (60% N,N-dimethylacetamide solution) | 10 |
| PF₆ salt of a condensate of p-diazodiphenylamine and formaldehyde | 0.5 |
| CH₂——CHCH₂OC₃H₆Si(OCH₃)₃ \O/ | 0.06 |
| TiO₂ | 0.12 |

-continued

| Component | Amount (part by weight) |
| --- | --- |
| Methyl ethyl ketone | 30 |
| Propylene glycol monomethyl ether | 20 |
| Fluorine atom containing surfactant | 0.01 |

Then, the plate was exposed to light for 100 counts through the use of an FT26IV UDNS ULTRA-PLUS FLIP-TOP PLATE MAKER (available from Nu Arc CO., LTD.) to completely photolyze the diazonium salt.

To the exposed primer layer, the photopolymerizable light-sensitive solution having the following composition was applied so that the amount of the composition coated was 3 g/m² (weighed after drying) and then dried at 100° C. for one minute.

| Component | Amount (part by weight) |
| --- | --- |
| Polyurethane solution (II) of Prep. Ex. 1 (60% N,N-dimethylacetamide solution) | 2.5 |
| Adduct of xylenediamine (1 mole) and glycidyl methacrylate (4 mole) | 0.6 |
| Polyethylene glycol (molecular weight 400) diacrylate | 0.4 |
| Ethyl Michler's ketone | 0.2 |
| Dimethylthioxanthone | 0.1 |
| Naphthalene sulfonate of Victoria Pure Blue BOH | 0.005 |
| Fluorine atom containing surfactant | 0.01 |
| Methyl ethyl ketone | 10 |
| Propylene glycol monomethyl ether | 10 |

Then, the composition for a silicone rubber layer having the following composition was applied to the light-sensitive layer thus formed so that the amount thereof coated was 2.0 g/m² (weighed after drying) and then dried at 140° C. for 2 minutes to thus obtain a cured silicone rubber layer.

| Component | Amount (part by weight) |
| --- | --- |
| α,ω-Divinyl polydimethyl siloxane (degree of polymerization = about 700) | 9 |
| (CH₃)₃Si—O—(Si(CH₃)₂O)₃₀(SiH(CH₃)—O)₁₀Si(CH₃)₃ | 1 |
| Polydimethyl siloxane (degree of polymerization = about 8,000) | 0.5 |
| Olefin-chloroplatinic acid catalyst solution | 0.2 |
| Inhibitor | 0.15 |
| Isopar G (available from ESSO CHEMICAL INC.) | 140 |

The silicone rubber layer thus formed was laminated with a single-side-matted, diaxially oriented polypropylene film having a thickness of 9 μm so that the non-matted surface of the film was brought into contact with the silicone rubber layer to obtain a dry PS plate.

A positive transparency having 200 lines/inch dots image was placed on the PS plate, brought into contact with the latter in vacuo, exposed to light for 30 counts through the use of an FT26IV UDNS ULTRA-PLUS FLIP-TOP PLATE MAKER (available from Nu Arc CO., LTD.) and then the laminate film was removed. The plate thus treated was immersed in tripropylene glycol at 40° C. for one minute and then rubbed with a developing pad to remove the silicone rubber layer in unexposed areas. Thus, a lithographic printing plate requiring no dampening water was obtained, the images of the positive transparency being faithfully reproduced on the whole surface of the lithographic printing plate. The printing plate was excellent in the adhesion between the light-sensitive layer and the primer layer and between the primer layer and the substrate. The light-sensitive layers in both non-image areas and image areas of the printing plate were not peeled off during the development, while the light-sensitive layer in image areas of a comparative printing plate whose primer layer did not contain the diazonium salt polycondensate was peeled off from the substrate.

EXAMPLE 2

The same procedures as in Example 1 were repeated except that the following composition for a primer layer was substituted for the composition for the primer layer used in Example 1 and then dried at 100° C. for two minutes to obtain a primer layer of 6 g/m² after drying.

| Component | Amount (part by weight) |
| --- | --- |
| Polyurethane solution (II) of Prep. Ex. 2 (60% N,N-dimethylacetamide solution) | 10 |
| Dodecylbenzene sulfonate of p-diazodiphenylamine and formaldehyde | 0.4 |
| CH₂——CHCH₂O—C₃H₆—Si(OCH₃)₃ (epoxy) | 0.06 |
| TiO₂ | 0.12 |
| Methyl ethyl ketone | 30 |
| Propylene glycol monomethyl ether | 20 |
| Fluorine atom containing surfactant | 0.01 |

Then, the same procedures as in Example 1 were repeated to obtain a dry PS plate.

In the same manner as in Example 1, the PS plate was imagewise exposed to light and the laminate film was removed. The plate thus treated was immersed in a developer having the following composition for one minute and then rubbed with a developing pad to remove the silicone rubber layer in unexposed areas. Thus, a lithographic printing plate requiring no dampening water was obtained, the images of the positive transparency being faithfully reproduced on the whole surface of the lithographic printing plate. The printing plate was excellent in the adhesion between the light-sensitive layer and the primer layer and between the primer layer and the substrate. The light-sensitive layers in both non-image areas and image areas of the printing plate were not peeled off during the development. Developer

| Component | Amount (part by weight) |
| --- | --- |
| Diethylene glycol mono-n-hexylether | 15 |
| Newcoal B4SN (available from Nippon Emulsifying Agent Manufacturing Co., Ltd.) (60% aqueous solution of the following compound) | 1 |

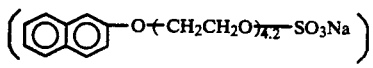

| Pure water | 84 |

EXAMPLES 3

On the 0.24 mm thick silicate treated aluminum plate as used in Example 1, a solution having the following composition was coated and heated at 140° C. for 2 minutes to prepare a primer layer of 5 g/m² after drying.

| Component | Amount (part by weight) |
| --- | --- |
| SANPRENE IB1700D (30% solution of thermoplastic polyurethane resin having terminal hydroxyl groups in methyl ethyl ketone, manufactured by SANYO CHEMICAL) | 10 |
| TAKENATE D110N (75% solution of polyfunctional isocyanate compound in ethyl acetate, manufactured by TAKEDA PHARMACEUTICALS CO., LTD) | 0.2 |
| Dodecylbenzene sulfonate of a condensate of p-diazodiphenylamine and formaldehyde | 0.3 |
| TiO₂ | 0.12 |
| Fluorine atom containing surfactant | 0.01 |
| Propylene glycol monomethyl ether acetate | 30 |

The photopolymerizable light-sensitive composition having the following composition was applied to the surface of the primer layer so that the coating amount was 3.0 g/m² after drying, and then dried at 100° C. for one minute.

| Component | Amount (part by weight) |
| --- | --- |
| Polyurethane resin solution (II) of Prep. Ex. 2 (60% N,N-dimethylacetamide solution) | 2.5 |
| Adduct of xylenediamine (1 mole) and glycidyl methacrylate (4 mole) | 0.6 |
| Polyethylene glycol (molecular weight 200) diacrylate | 0.4 |
| Ethyl Michler's ketone | 0.2 |
| 2-Chlorothioxanthone | 0.05 |
| 2-Chloro-N-butylacridone | 0.15 |
| Oil Blue #603 (oil soluble dye manufactured by ORIENT CHEMICAL) | 0.01 |
| Fluorine atom containing surfactant | 0.01 |
| Methyl ethyl ketone | 15 |
| Ethylene glycol methyl ether | 5 |

Then, a solution having the following composition was applied to the light-sensitive layer thus formed so that the amount thereof coated was 2.0 g/m² after drying and then dried at 120° C. for 2 minutes to thus obtain a silicone rubber layer.

| Component | Amount (part by weight) |
| --- | --- |
| α,ω-Dihydroxy polydimethyl siloxane (degree of polymerization = about 700) | 9 |
| CH₃—Si—(O—COCH₃)₃ | 0.3 |
| Tin catalyst | 0.1 |
| Isopar G (available from ESSO CHEMICAL INC.) | 140 |

In the same manner as in Example 1, the silicone rubber layer thus formed was laminated with a single-side-matted, diaxially oriented polypropylene film having a thickness of 9 μm to obtain a dry PS plate.

In the same manner as in Example 2, the dry PS plate was imagewise exposed to light and developed to obtain a dry lithographic printing plate which was excellent in dot reproduction.

EXAMPLE 4

On the 0.24 mm thick silicate treated aluminum plate as used in Example 1, the solution for the primer layer as used in Example 1 was coated and heated at 100° C. for 2 minutes to prepare a primer layer Of 4 g/m² after drying. The primer layer was irradiated with electron beams using an electron beam irradiator (manufactured by Energy Science Inc.) at 150 KV in an amount of 2 Mrad to fully decompose the diazonium salt.

Then, the same procedures as in Example 1 were repeated to obtain a dry PS plate. The plate was imagewise exposed to light and developed in the same manner as in Example 1 to prepare a dry lithographic printing plate which was excellent in dot reproduction. The adhesion between the substrate and the primer layer was good and the primer layer was not peeled off during the development.

What is claimed is:

1. A presensitized plate for use in making a lithographic printing plate requiring no dampening water comprising a substrate having provided thereon (i) a primer layer, (ii) a light-sensitive layer and (iii) a silicon rubber layer in this order, wherein the primer layer (i) comprises a cured layer obtained, prior to coating of the light sensitive layer (ii), by irradiation of actinic rays or electron beams of a light sensitive layer containing, in admixture, a film forming amount of a film forming polyurethane resin and a light sensitizing amount of a diazonium salt polycondensate and wherein said light-sensitive layer (ii) comprises, in admixture, a photopolymerizable light-sensitive composition which contains the following components:
   (a) a photopolymerizable monomer or oligomer composed of an ethylenically unsaturated monomer or oligomer having a boiling point of not less than 100° C.; and
   (b) a photopolymerization initiator.

2. The presensitized plate of claim 1 wherein the diazonium salt polycondensate is a light-sensitive compound having a structural unit of formula (I):

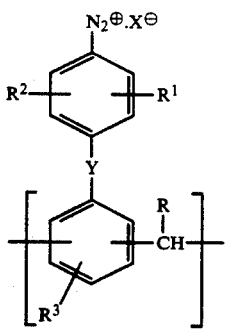

wherein $R^1$, $R^2$ and $R^3$ represent hydrogen atoms, halogen atoms, alkyl, alkoxy, aryl, substituted aryl, sulfonic acid, sulfoalkyl, carboxyl or carboxylic acid ester groups, R represents a hydrogen atom, an alkyl, aryl, substituted aryl or carboxyl group, X represents a counter anion of the diazonium salt, Y represents —(CH$_2$). —NR$^4$—, —O—(CH$_2$) , —NR$^4$—, —S—(CH$_2$), —NR$^4$—, —S—CH$_2$CONR$^4$—, —O—R$^5$—O—, —O—, —S— or —CONR$^4$— wherein q is an integer of 0 to 5 and r is an integer of 2 to 5, $R^4$ represents a hydrogen atom, an alkyl group having 1 to 5 carbon atoms, an aralkyl group having 7 to 12 carbon atoms or an aryl group having 6 to 12 carbon atoms and $R^5$ represents an arylene group having 6 ot 12 carbon atoms.

3. The presensitized plate of claim 2 wherein the diazonium salt polycondensate is selected from the group consisting of hexafluorophosphates, tetrafluoroborates, phosphates, sulfonates, phosphinates, hydroxy group containing compound salts and organic carboxylates of polycondensats of p-diazodiphenylamine and formaldehyde or acetaldehyde.

4. The presensitized plate of claim 1 wherein the film forming polyurethane resin is a polymer obtained by an addition reaction between a polyisocyante and a polyol and has the weight average molecular weight of more than 5,000.

5. The presensitized plate of claim 1 wherein the primer layer contains a silane coupling agent.

6. The presensitized plate of claim 1 wherein the primer layer is coated in an amount of 1 to 50 g/m² after drying.

7. The presensitized plate of claim 1 wherein the photopolymerizable light-sensitive composition further contains a heat polymerization inhibitor.

8. The presensitized plate of claim 1 wherein the photopolymerizable monomer or oligomer is selected from the group consisting of (meth)acrylates or (meth)acrylamides having a boiling point of not less than 100° C. derived from monovalent alcohols or monovalent amines having 30 or less carbon atoms and (meth)acrylates or (meth)acrylamides having a boiling point of not less than 100° C. derived from polyvalent alcohols or polyvalent amines having 80 or less carbon atoms.

9. The presensitized plate of claim 1 wherein the photopolymerizable monomer or oligomer is selected from the group consisting of ethyleneglycol di(meth)acrylate, polyethyleneglycol di(meth)acrylate, trimethylolethane tri(meth) acrylate, trimethylolpropane tri(-meth)acrylate, pentaerythritol tetra(meth)acrylate, pentaerythritol tri(meth)acrylate, dipentaerythritol penta(-meth)acrylate and dipentaerythritol hexa(meth)acrylate.

10. The presensitized plate of claim 1 wherein the light-sensitive layer further contains a film forming solvent soluble polyurethane resin as a binder.

11. The presensitized plate of claim 10 wherein the structural unit of the film forming solvent soluble polyurethane resin is identical with or similar to that of the polyurethane resin used in the primer layer.

12. The presensitized plate of claim 11 wherein the film forming solvent soluble polyurethane resin is the same as that of the polyurethane resin used in the primer layer and it is selected from the group consisting of polyurethane resins derived from a polyisocyanate and a polyester polyol, polyether polyol or polyalcohol; and polyurethane resins having urea bonds which are obtained by substituting a polyamine for a part of the polyol and chain-extending.

13. The presensitized plate of claim 10 wherein the film forming solvent soluble polyurethane is contained in the light-sensitive layer in the amount of 10 to 90% by weight based on the solid content of the light-sensitive layer.

14. The presensitized plate of claim 1 wherein the thickness of the primer layer ranges from 0.5 to 20 g/m² expressed in the amount determined after drying.

15. The presensitized plate of claim 1 wherein the amount of the light-sensitive layer coated ranges from about 0.1 to 10 g/m² after drying.

16. The presensitized plate of claim 1 wherein the silicone rubber layer is a linear or a partially crosslinked polydiorganosiloxane having the following repeating units:

—Si(R)₂—O— wherein R represents a monovalent group such as an alkyl, aryl or alkenyl group or a combination thereof which may have functional groups selected from the group consisting of halogen atoms, amino groups, hydroxyl group, alkoxy groups, aryloxy groups, (meth)acryloxy groups and thiol groups.

17. The presensitized plate of claim 1 wherein the silicone rubber layer comprises at least one member selected from the group consisting of an inorganic substance selected from fine powder of silica, calcium carbonate or titanium oxide; a silane coupling agents, a titanate coupling agent, an aluminum coupling agent, and a photopolymerization initiator.

18. The presensitized plate of claim 17 wherein the silicone rubber layer is obtained by hardening and crosslinking a composition comprising:
(1) 100 parts by weight of an organopolysiloxane having at least two alkenyl groups which are directly bonded to the silicon atom;
(2) 0.1 to 1,000 parts by weight of an organo hydrogen polysiloxane having at least two ≡SiH bonds in the molecule; and
(3) 0.00001 to 10 parts by weight of a catalyst for addition polymerization.

* * * * *